(12) United States Patent
Hung et al.

(10) Patent No.: US 9,467,173 B2
(45) Date of Patent: Oct. 11, 2016

(54) MULTI-CODE CHIEN'S SEARCH CIRCUIT FOR BCH CODES WITH VARIOUS VALUES OF M IN GF($2^m$)

(71) Applicant: Storart Technology Co., Ltd., Hsinchu (TW)

(72) Inventors: Jui Hui Hung, Hsinchu (TW); Chih Nan Yen, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 127 days.

(21) Appl. No.: 14/445,782

(22) Filed: Jul. 29, 2014

(65) Prior Publication Data
US 2016/0036464 A1    Feb. 4, 2016

(51) Int. Cl.
| | | |
|---|---|---|
| H03M 13/00 | (2006.01) | |
| H03M 13/15 | (2006.01) | |
| H03M 13/27 | (2006.01) | |
| H03M 13/29 | (2006.01) | |
| G11B 20/18 | (2006.01) | |

(52) U.S. Cl.
CPC ....... *H03M 13/1545* (2013.01); *H03M 13/151* (2013.01); *H03M 13/152* (2013.01); *H03M 13/158* (2013.01); *H03M 13/6516* (2013.01); *G06F 2207/581* (2013.01); *G11B 20/1833* (2013.01); *H03M 13/27* (2013.01); *H03M 13/29* (2013.01)

(58) Field of Classification Search
CPC ............. H03M 13/15; H03M 13/152; H03M 13/151; H03M 13/1525; H03M 13/1545; H03M 13/6516; H03M 13/29; H03M 13/2957; H03M 13/2906; H03M 13/27; G06F 2207/581; G11B 20/1833
USPC ......................................... 714/755, 781, 782
See application file for complete search history.

(56) References Cited

U.S. PATENT DOCUMENTS

| | | | | |
|---|---|---|---|---|
| 3,771,126 A | * | 11/1973 | Apple, Jr. | ............... H04L 1/004 714/782 |
| 6,637,002 B1 | * | 10/2003 | Weng | ............... H03M 13/6561 708/507 |
| 7,058,876 B1 | * | 6/2006 | Ireland | ............... H03M 13/153 714/781 |
| 8,875,001 B1 | * | 10/2014 | Mazahreh | ......... H03M 13/1525 714/781 |

(Continued)

OTHER PUBLICATIONS

IEEE Transactions on Circuits and Systems—II: Express Briefs, vol. 58, No. 8, Aug. 2011 Low-Complexity Parallel Chien Search Structure Using Two-Dimensional Optimization by Youngjoo Lee et al. pp. 522-526.*

Primary Examiner — Esaw Abraham
Assistant Examiner — Osman M Alshack
(74) *Attorney, Agent, or Firm* — Che-Yang Chen; Law Offices of Michael Chen

(57) ABSTRACT

The present invention discloses a multi-code Chien's search circuit for BCH codes with various values of m in GF($2^m$). The circuit includes: a combined matrix unit, a number of first multiplexers, a number of registers and a number of second multiplexers. By designing the Chien's search circuit having several Chien's search matrices, with peripheral components, it is able to achieve applications for different code rates, different code lengths and even different m in GF($2^m$).

10 Claims, 8 Drawing Sheets

(56) References Cited

U.S. PATENT DOCUMENTS

| | | | |
|---|---|---|---|
| 2004/0078747 A1* | 4/2004 | Miller | H03M 13/151 714/782 |
| 2010/0257433 A1* | 10/2010 | Weingarten | G06F 11/1068 714/782 |
| 2011/0239094 A1* | 9/2011 | Kwok | G06F 7/724 714/782 |
| 2012/0317457 A1* | 12/2012 | Anholt | H03M 13/1525 714/755 |
| 2014/0026010 A1* | 1/2014 | Anholt | H03M 13/1515 714/758 |
| 2014/0089768 A1* | 3/2014 | Fujiwara | G06F 11/10 714/785 |
| 2014/0095960 A1* | 4/2014 | Chu | H03M 13/152 714/763 |
| 2015/0128011 A1* | 5/2015 | Rochman | G06F 11/1008 714/773 |
| 2015/0311920 A1* | 10/2015 | Wang | H03M 13/1555 714/764 |

* cited by examiner

MULTI-CODE CHIEN'S SEARCH CIRCUIT FOR BCH CODES WITH VARIOUS VALUES OF M IN GF($2^m$)

FIELD OF THE INVENTION

The present invention relates to a multi-code Chien's search circuit. More particularly, the present invention relates to a multi-code Chien's search circuit for BCH codes with various values of m in GF($2^m$).

BACKGROUND OF THE INVENTION

Bose-Chaudhuri-Hocquenghem (BCH) code is one of the most widely used error correction code (ECC) techniques in the storage and communication devices. BCH code can detect and correct random errors occurred due to channel noises and defects within memory devices. The encoding procedures of BCH code word can be implemented by linear feedback shift register (LFSR) and some combination logics together. Comparing with encoding procedures of the BCH code words, decoding procedures of the BCH code words are much complicated as shown in FIG. 1. Decoding procedures are as below: After receiving a code word (S01), in order to decode it, one should compute a syndrome according to specified polynomials (S02). Then, depending on the syndrome, an error-location polynomial can be found (S03). Next, by calculating the roots of the error-location polynomial, error-location numbers can be obtained (S04). Finally, an erroneous code word can be corrected by above steps (S05).

Conventionally, Peterson-Gorenstein-Zierler (PGZ) algorithm or Berlekamp-Massey (BM) algorithm can be used to find out the aforementioned error-location polynomial. Since the complexity of the PGZ algorithm is higher than the BM algorithm and the BM algorithm can process decoding with faster speed, the BM algorithm is more popular in hardware implementation. However, due to the multiplication inverse used in the BM algorithm, complexity of hardware of the circuit increases significantly.

According to the error-location polynomial $\lambda(x)=\lambda_0 + \lambda_1 x + \ldots + \lambda_t x^t$, the roots of $\lambda(x)$ can be found simply by substituting $1, \alpha, \alpha^2, \ldots, \alpha^{n-1}$ ($n=2^m-1$) into $\lambda(x)$. Since $\alpha^n=1$, $\alpha^{-1}=\alpha^{n-1}$. Therefore, if $\alpha^1$ is an error-location number, $\alpha^{n-1}$ is another error-location number. Conventionally, this substitution procedure can be operated iteratively by Chien's search. However, this sequential circuit only can find one error location number per clock. In order to improve the throughput of BCH decoding per clock, parallel computation architecture can be applied in the step of Chien's search as shown in FIG. 2. Therefore, p error locations can be found in one clock.

Let $\lambda_1 x + \ldots + \lambda_t x^t$ in the error location polynomial $\lambda(x)$ to be $Y(x)$. If $\alpha^i$ is a root of $\lambda(x)$, we can have $Y(\alpha^i)=1$. Under an architecture of p parallel computations, $Y(\alpha^{up+i})$ can be reformed as:

$$Y(\alpha^{up+i}) = \sum_{j=1}^{t} \lambda_j \alpha^{upj} \alpha^{ij} = \sum_{j=1}^{t} \omega_j \alpha^{ij}$$

Due to parallelization, the number of iterative operations becomes [n/p]. Numeral u represents the number of iterative operations currently and $\omega_j$ is an updated value in each iterative operations, where $1 \leq i \leq p$ and $1 \leq j \leq t$. When the order in Galois field in $2^m$, there are pt finite field multipliers, p t-input m-bit finite field adders, t m-bit registers and t m-bit multiplexers in the parallel computation architecture in FIG. 2.

If $\omega_j \alpha^{ij}$ in the above function is expressed as a matrix, we can have $$\omega_j \alpha^{ij} = (\omega_{j0} + \omega_{j1}\alpha + \ldots + \omega_{j,m-1}\alpha^{m-1})\alpha^{ij}$$
$$= (\omega_{j0}\alpha^{ij} + \omega_{j1}\alpha^{ij+1} + \ldots + \omega_{j,m-1}\alpha^{ij+m-1})$$
$$= [\omega_{j0} \quad \omega_{j1} \quad \ldots \quad \omega_{j,m-1}] \times$$

$$\begin{bmatrix} \alpha_0^{ij} & \alpha_1^{ij} & \ldots & \alpha_{m-1}^{ij} \\ \alpha_0^{ij+1} & \alpha_1^{ij+1} & \ldots & \alpha_{m-1}^{ij+1} \\ \vdots & \vdots & \ddots & \vdots \\ \alpha_0^{ij+m-1} & \alpha_1^{ij+m-1} & \ldots & \alpha_{m-1}^{ij+m-1} \end{bmatrix}$$

$$= \Omega_j A_{ij},$$

where $\Omega_j$ and $A_{ij}$ are a binary m×m matrix and a binary 1×m matrix, respectively. $\omega_j \alpha^{ij}$ represents computed results from a finite field multiplexer the $i^{th}$ row and the $j^{th}$ column. Therefore, $Y(\alpha^{up+i})$ can be derived from:

$$Y(\alpha^{up+i}) = \sum_{j=1}^{t} \Omega_j A_{ij} = [\Omega_1 \quad \Omega_2 \quad \ldots \quad \Omega_t] \begin{bmatrix} A_{i1} \\ A_{i2} \\ \vdots \\ A_{it} \end{bmatrix}.$$

Please notice that $Y(\alpha^{up+i})$ is a 1×m matrix. In order to express all outputs in FIG. 2, there should be a matrix including all outputs, Y(u), in the uth iterative operation. Hence, Y(u) can be shown as below matrix:

$$Y(u) = [Y(\alpha^{up+1}) \quad Y(\alpha^{up+2}) \quad \ldots \quad Y(\alpha^{up+p})]$$

$$= [\Omega_1 \quad \Omega_2 \quad \ldots \quad \Omega_t] \begin{bmatrix} A_{11} & A_{21} & \ldots & A_{p1} \\ A_{12} & A_{22} & \ldots & A_{p2} \\ \vdots & \vdots & \ddots & \vdots \\ A_{1t} & A_{2t} & \ldots & A_{pt} \end{bmatrix}$$

$$= \Omega(u) A_y,$$

where $\Omega(u)$ is a 1×mt binary matrix, representing intermediate values of the $u^{th}$ iterative operation, $A_y$ is constant and independent of the iterative operation. It should be noticed that computations of the Chien's search under the architecture of p parallel computations are all formulated in one single matrix from the multiplication of $\Omega(u)$ and $A_y$.

Further, updated values of $\Omega(u)$ can be used in the next iterative operations. Thus, $\Omega(u+1)=[\omega_1\alpha^p \quad \omega_2\alpha^{2p} \quad \ldots \quad \omega_t\alpha^{tp}]$ and $$\Omega(u+1) = [\Omega_1 \quad \Omega_2 \quad \ldots \quad \Omega_t] \begin{bmatrix} A_{1p} & 0 & \ldots & 0 \\ 0 & A_{2p} & \ldots & 0 \\ \vdots & \vdots & \ddots & \vdots \\ 0 & 0 & \ldots & A_{tp} \end{bmatrix} = \Omega(u+1) A_\Omega$$

Finally, it is obtained that $[Y(u) \Omega(u+1)]=\Omega(u)[A_y, A_\Omega]$. The Chien's search circuit having the architecture of p parallel computations for implementing the aforementioned formula is shown in FIG. 3. The circuit design was disclose in IEEE Transactions on circuits and systems-II: Express Briefs, Vol. 58, No. 8, on August 2011, titled Low Complexity Parallel Chien's Search Structure Using Two-Dimensional Optimization, by Youngjoo Lee et al. The outputted error vectors can be available by processing XOR for the outputs of Y(u) and $\lambda_0$.

The circuit design mentioned above can only applied to a fixed code rate and coed length over the same $GF(2^m)$. For some applications requiring different code rates, coed lengths even different m in $GF(2^m)$, it is not applicable. Hence, a new Chien's search circuit is needed to fulfill the above requirement.

SUMMARY OF THE INVENTION

According to the description mentioned above, circuit designs for encoding BCH codes can only be applicable for the fixed code rate, fixed coed length and the same value of m in $(2^m)$. Therefore, a new Chien's search circuit is required for applications on different code rates, different coed lengths and different m in $GF(2^m)$ Therefore, according to an aspect of the present invention, a multi-code Chien's search circuit for BCH codes with various values of m in $GF(2^m)$ is disclosed. The circuit includes: a combined matrix unit, for providing a number of Chien's search matrices, receiving a number of inputted values, multiplying the inputted values by partial or all elements in one or more Chien's search matrix to get first operation values and second operation values, outputting the first operation values, and outputting the second operation values according to different properties of the inputted values via one of a number of line groups; a number of first multiplexers, each first multiplexer connected with one line in each line group and receiving specific second operation values, for choosing the second operation values from the corresponding line group according to different properties of the inputted values, and outputting the second operation values; a number of registers, each register connected with a specific first multiplexer, for receiving the second operation values, and outputting the second operation values in a next clock; and a number of second multiplexers, each second multiplexer connected with a specific register, receiving a value of a specific coefficient except a constant coefficient in an error location polynomial and the second operation values from the register, for outputting the value of the specific coefficient as the inputted value to the combined matrix unit in the first iterative operation of Chien's search, and outputting the second operation values to the combined matrix unit as the inputted values in the rest iterative operations of Chien's search. Values of specific coefficients of the error location polynomial for the same Chien's search matrix and the second operation values obtained by processing the values of specific coefficients have the same properties of the inputted values.

The Chien's search matrix has a form of $[A_y, A_\Omega]$, where $$A_y = \begin{bmatrix} A_{11} & A_{21} & \cdots & A_{p1} \\ A_{12} & A_{22} & \cdots & A_{p2} \\ \vdots & \vdots & \ddots & \vdots \\ A_{1t} & A_{2t} & \cdots & A_{pt} \end{bmatrix},$$

-continued $$A_\Omega = \begin{bmatrix} A_{1p} & 0 & \cdots & 0 \\ 0 & A_{2p} & \cdots & 0 \\ \vdots & \vdots & \ddots & \vdots \\ 0 & 0 & \cdots & A_{tp} \end{bmatrix}, \text{ and}$$

$$A_{ij} = \begin{bmatrix} \alpha_0^{ij} & \alpha_1^{ij} & \cdots & \alpha_{m-1}^{ij} \\ \alpha_0^{ij+1} & \alpha_1^{ij+1} & \cdots & \alpha_{m-1}^{ij+1} \\ \vdots & \vdots & \ddots & \vdots \\ \alpha_0^{ij+m-1} & \alpha_1^{ij+m-1} & \cdots & \alpha_{m-1}^{ij+m-1} \end{bmatrix},$$

where p is a number of parallel computations that the Chien's search circuit has; t is an error correction ability corresponding to the BCH code; $\alpha_0, \alpha_1, \ldots \alpha_{m-1}$ form a standard basis in $GF(2^m)$; $1 \le i \le p$; $1 \le j \le t$.

Preferably, different Chien's search matrices correspond to different m and/or t. Each Chien's search matrix is equally divided into a number of portions in the row direction with the number of portions being the same as the number of the error correction ability of the corresponding BCH code. Each portion has sub-matrices in the corresponding $A_y$ and $A_\Omega$. Each portion of one Chien's search matrix is aligned with that of another Chien's search matrix sequentially by a method. The method is aligning in one side, aligning centrally, or offsetting a certain amount from one side.

According to the present invention, the locations where are not covered by the portions of the Chien's search matrix are set to be elements of 0 in the combined matrix unit. The Chien's search matrices are separated by elements of 0. There are common sub-expressions in partial elements in two Chien's search matrices and one Chien's search matrix utilizes the common sub-expressions of the other Chien's search matrix. The first operation value further adds to a value of a constant coefficient of the error location polynomial; if the sum is 0, the corresponding element, $\alpha^{up+i}$ where $1 \le i \le p$, is a root of the error location polynomial.

Hence, according to the description mentioned above, by designing the Chien's search circuit having several Chien's search matrices, with peripheral components, it is able to achieve applications for different code rates, different code lengths and even different m in $GF(2^m)$. Meanwhile, the complexity of hardware of the Chien's search circuit can be reduced.

DETAILED DESCRIPTION OF THE PREFERRED EMBODIMENTS

The present invention will now be described more specifically with reference to the following embodiments.

Figure 1:
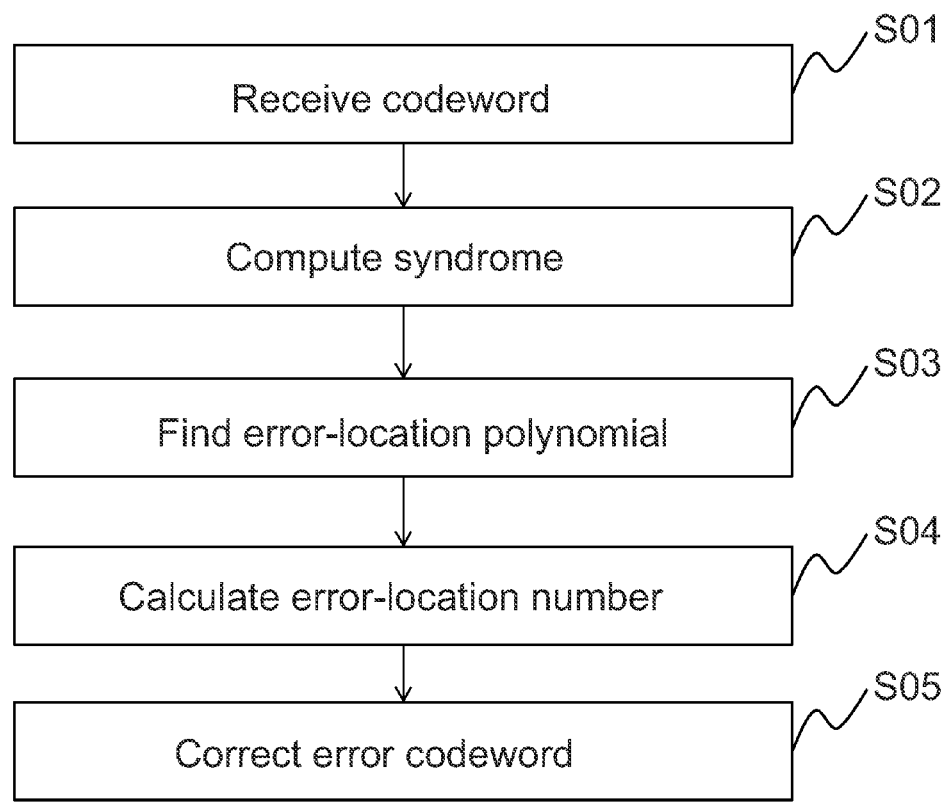
FIG. 1 is a flow chart of a conventional decoding method for BCH codes.
Figure 2:
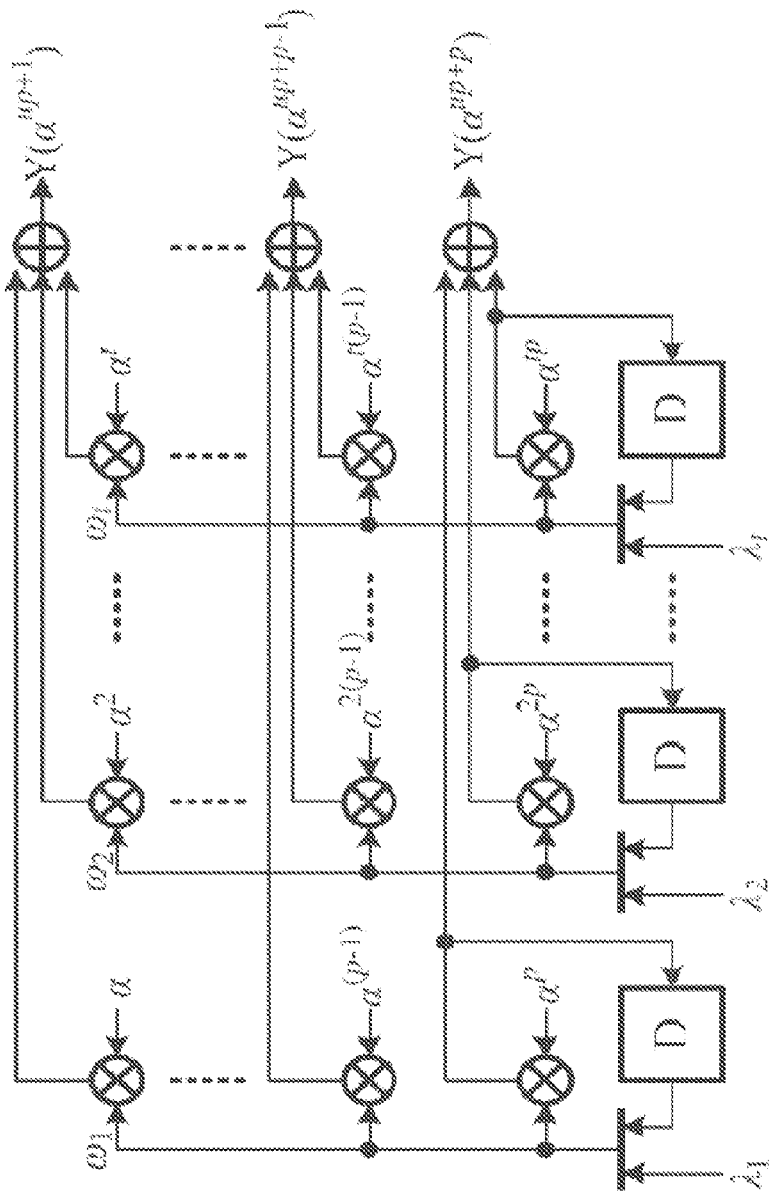
FIG. 2 is a conventional circuit for implementing Chien's search.
Figure 3:
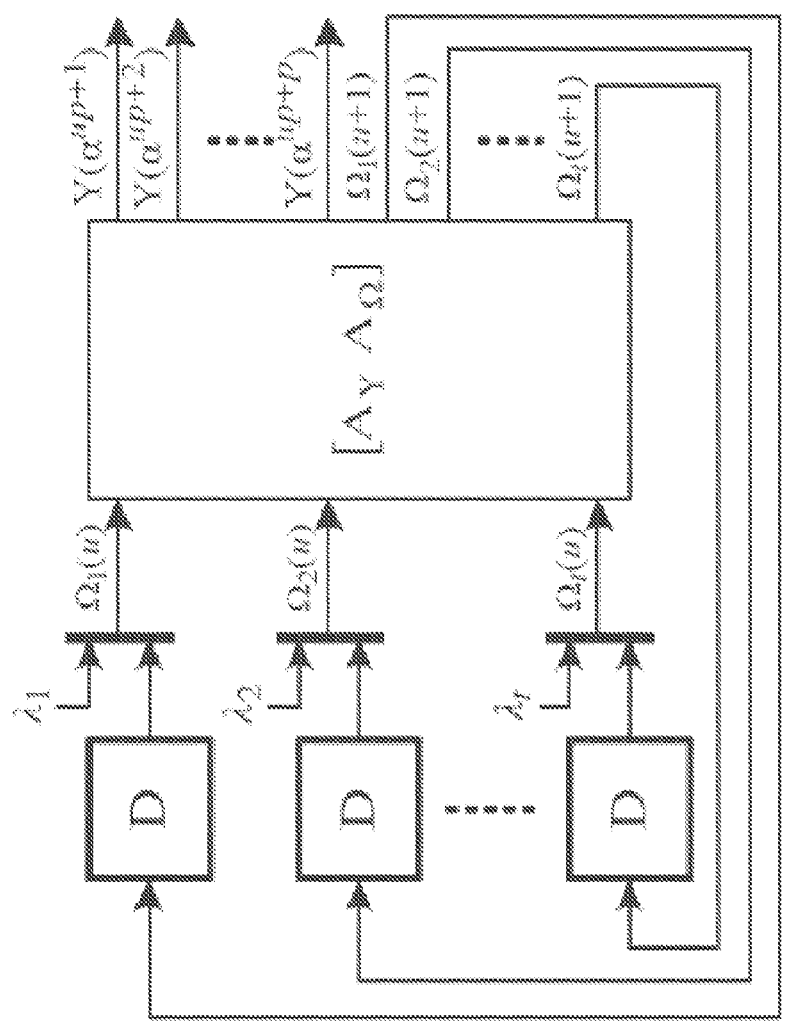
FIG. 3 is another conventional circuit for implementing Chien's search.
Figure 4:
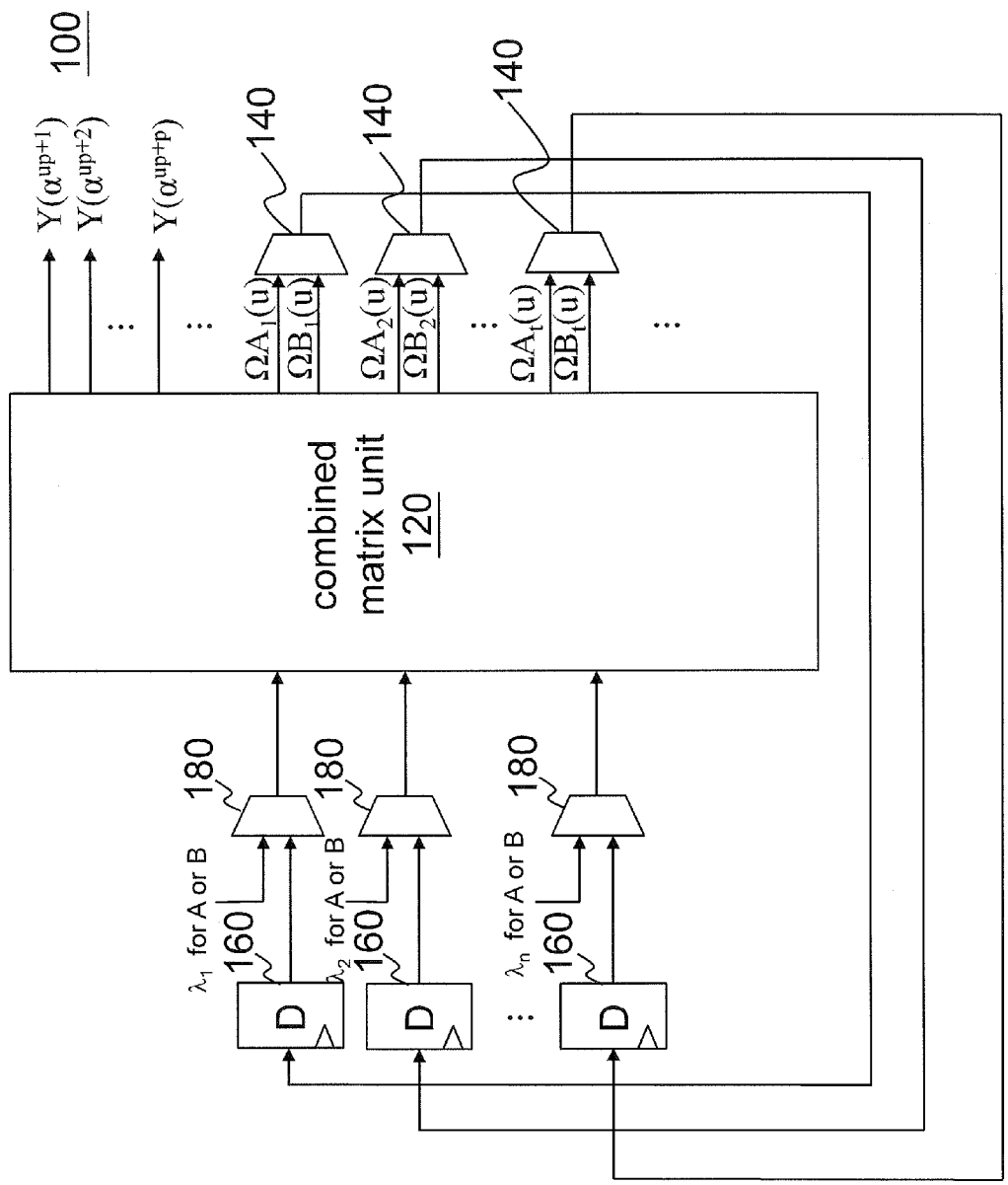
FIG. 4 is an embodiment of a multi-mode Chien's search circuit according to the present invention.
Figure 5:
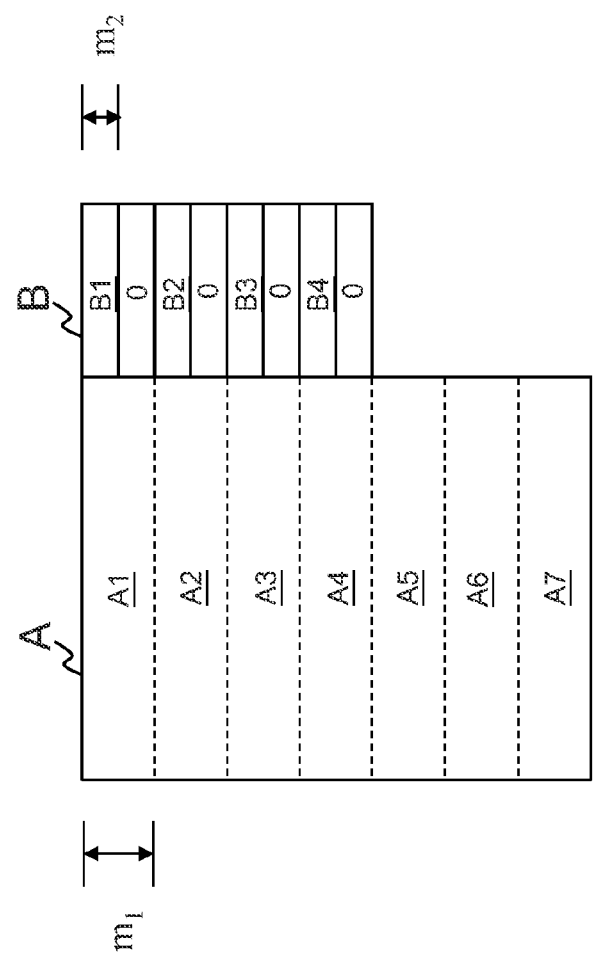
FIG. 5 illustrates an arrangement of a combined matrix unit in the embodiment.
Figure 6:
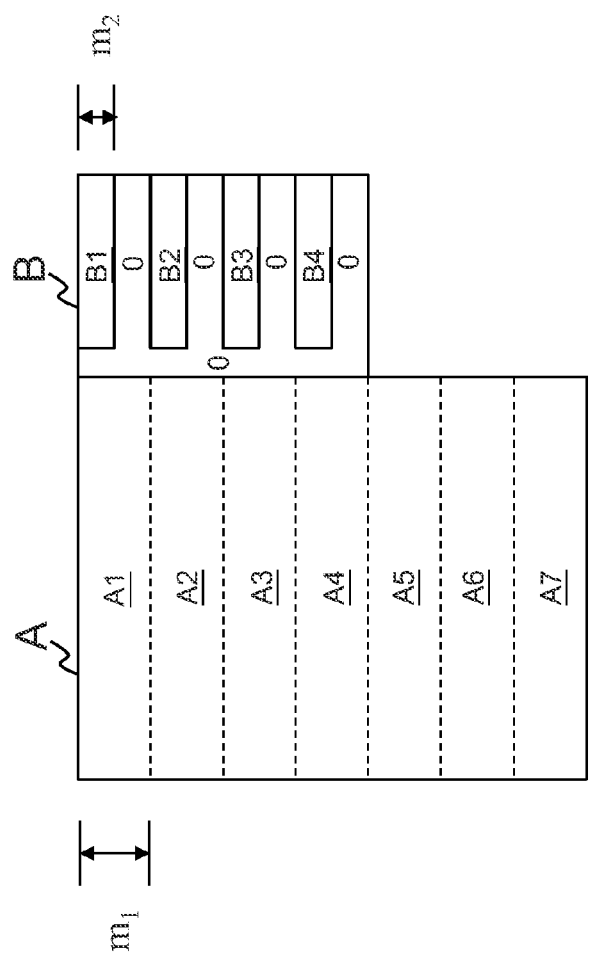
FIG. 6 illustrates another arrangement of a combined matrix unit in the embodiment.

Please refer to FIG. 4 to FIG. 6. One embodiment is illustrated. A multi-modes Chien's search circuit 100 is applicable to BCH codes having different values of m in $GF(2^m)$. In the present embodiment, two different values of m, $m_1$ and $m_2$ ($m_1 > m_2$), are used for illustration. The BCH cods according to these two values have different code lengths and code rates (for $m_1 > m_2$, related code lengths are $2^{m_1} > 2^{m_2}$, while code rates are unsure). Each of the BCH codes has $t_1$ and $t_2$ error correction ability, respectively. In the present embodiment, it is set that $t_1 > t_2$. As shown in FIG. 4, the Chien's search circuit 100 includes one combined matrix unit 120, t first multiplexers 140, t registers 160, and t second multiplexers 180. They are described below in details.

The combined matrix unit 120 is the core element. It is used to provide two or more than two Chien's search matrices. In the present embodiment, the combined matrix unit 120 includes two Chien's search matrices, a Chien's search matrix A and a Chien's search matrix B. The Chien's search matrix A is used to find out the roots of an error location polynomial a. Coefficients of the error location polynomial a are found by receiving a BCH code $C_1$ having $t_1$-error correction ability, finding out syndromes and processing BM algorithm. Similarly, the Chien's search matrix B is used to find out the roots of an error location polynomial b. Coefficients of the error location polynomial b are found by receiving a BCH code $C_2$ having $t_2$-error correction ability, finding out syndromes and processing BM algorithm. Structures of the Chien's search matrix A and Chien's search matrix B will be introduced later. It should be noticed that the combined matrix unit 120 can be formed by any electronic components, such as /Read Only Memory (ROM) array, to keep the element of 0 or 1 in the Chien's search matrix.

The combined matrix unit 120 can receive a number of inputted values. As shown in FIG. 4, these inputted values come from the second multiplexers 180. The combined matrix unit 120 multiplies the inputted values by partial or all elements in one or more Chien's search matrices to get first operation values and second operation values. In the present embodiment, although the Chien's search matrix A is used for BCH code $C_1$ and the Chien's search matrix B is used for BCH code $C_2$, since the Chien's search matrix A and Chien's search matrix B have common sub-expressions, the Chien's search matrix B can share some elements in the Chien's search matrix A.

Here, the first operation values, are $Y(\alpha^{up+i})$ in the prior art mentioned in the BACKGROUND OF THE INVENTION, the outputs in each iterative operation (Numeral u is the number of iterative operations, Numeral p means the number of parallel computations of the combined matrix unit 120, $\alpha^{up+i}$ is a potential root for Chien's search, $1 \leq i \leq p$). By judging if the sum of $Y(\alpha^{up+i})$ and value of a constant coefficient of the error location polynomial, $\lambda_0$, to determine that if the corresponding element, $\alpha^{up+i}$, is a root of the error location polynomial. The second operation values are intermediate values in the iterative operations. They are inputted again to the combined matrix unit 120 for another operation. The combined matrix unit 120 can output the first operation values, and output the second operation values via one of two line groups according to different properties of the inputted values. Values of specific coefficients of the error location polynomial for the same Chien's search matrix and the second operation values obtained by processing the values of specific coefficients have the same properties of the inputted values. It is to say that when the values of coefficients for the same Chien's search matrix are inputted by the second multiplexer 180 in the clock of a first iterative operation and the second operation values computed later therefrom, all have the same properties of the inputted values. For the convenience of operation of the first multiplexer 140, each output of the second operation values for different properties of the inputted values uses a specified line. As shown in FIG. 4, it is one of the two lines linked to the first multiplexers 140. The lines for inputting second operation values $\Omega A_1(u), \Omega A_2(u) \ldots \Omega A_t(u)$ calculated from the Chien's search matrix A are in one line groups. The lines for inputting second operation values $\Omega B_1(u), \Omega B_2(u) \ldots \Omega B_t(u)$ calculated from the Chien's search matrix B are in another line groups. It should be noticed that the number of line groups is not limited to 2, it can be any number as long as it is greater than or equal to the number of Chien's search matrices.

In the present embodiment, the number of the first multiplexer 140 is t. Numeral t should be greater than or equal to the bigger one of $t_1$ and $t_2$ so that the BCH code having the maximum error correction ability can be decoded. Meanwhile, the Numeral t is the highest power of the error location polynomial in processed. As mentioned above, each first multiplexer 140 is connected with one line in each line groups and receives specific second operation values from the combined matrix unit 120. The first multiplexer 140 can choose the second operation values from the corresponding line group according to different properties of the inputted values. Then, output the second operation values to the connected register 160.

In the t registers 160, each register 160 is connected to a specific first multiplexer 140, respectively, to receive the second operation values and output the second operation values to the connected second multiplexer 180 in a next clock. Due to operation of the registers 160, the Chien's search circuit 100 can process one iterative operation per clock.

Each second multiplexer 180 is connected to a specific register 160, capable of receiving a value of a specific coefficient except a constant coefficient in an error location polynomial (e.g. $\lambda_1, \lambda_2 \ldots \lambda_n$ in FIG. 4) and the second operation values from the register 160. Functions of the second multiplexer 180 are outputting the value of the specific coefficient to the combined matrix unit 120 as the inputted value in a first iterative operation in the beginning of Chien's search operation, and outputting the second operation values as the inputted values to the combined matrix unit 120 in the rest iterative operations of the Chien's search operation.

Here, the structures of the Chien's search matrix A and Chien's search matrix B are illustrated. The Chien's search matrix A has a form of $[A_y, A_\Omega]$, where $$A_y = \begin{bmatrix} A_{11} & A_{21} & \ldots & A_{p1} \\ A_{12} & A_{22} & \ldots & A_{p2} \\ \vdots & \vdots & \ddots & \vdots \\ A_{1t} & A_{2t_1} & \ldots & A_{pt_1} \end{bmatrix},$$

-continued $$A_\Omega = \begin{bmatrix} A_{1p} & 0 & \cdots & 0 \\ 0 & A_{2p} & \cdots & 0 \\ \vdots & \vdots & \ddots & \vdots \\ 0 & 0 & \cdots & A_{t_1 p} \end{bmatrix}, \text{ and}$$

$$A_{ij} = \begin{bmatrix} \alpha_0^{ij} & \alpha_1^{ij} & \cdots & \alpha_{m_1-1}^{ij} \\ \alpha_0^{ij+1} & \alpha_1^{ij+1} & \cdots & \alpha_{m_1-1}^{ij+1} \\ \vdots & \vdots & \ddots & \vdots \\ \alpha_0^{ij+m_1-1} & \alpha_1^{ij+m_1-1} & \cdots & \alpha_{m_1-1}^{ij+m_1-1} \end{bmatrix},$$

where p is the number of parallel computation that the Chien's search circuit has; t1 is the error correction ability corresponding to BCH code $C_1$; $\alpha_0, \alpha_1, \ldots$ and $\alpha_{m1-1}$ form a standard basis in $GF(2^{m1-1})$; $1 \le i \le p$; $1 \le j \le t_1$. Chien's search matrix B has a form of $[B_y, B_\Omega]$, where $$B_y = \begin{bmatrix} B_{11} & B_{21} & \cdots & B_{p1} \\ B_{12} & B_{22} & \cdots & B_{p2} \\ \vdots & \vdots & \ddots & \vdots \\ B_{1t} & B_{2t_2} & \cdots & B_{pt_2} \end{bmatrix},$$

$$B_\Omega = \begin{bmatrix} B_{1p} & 0 & \cdots & 0 \\ 0 & B_{2p} & \cdots & 0 \\ \vdots & \vdots & \ddots & \vdots \\ 0 & 0 & \cdots & B_{t_2 p} \end{bmatrix}, \text{ and}$$

$$B_{ij} = \begin{bmatrix} \alpha_0^{ij} & \alpha_1^{ij} & \cdots & \alpha_{m_2-1}^{ij} \\ \alpha_0^{ij+1} & \alpha_1^{ij+1} & \cdots & \alpha_{m_2-1}^{ij+1} \\ \vdots & \vdots & \ddots & \vdots \\ \alpha_0^{ij+m_2-1} & \alpha_1^{ij+m_2-1} & \cdots & \alpha_{m_2-1}^{ij+m_2-1} \end{bmatrix},$$

where $t_2$ is the error correction ability corresponding to BCH code C2; $\alpha_0, \alpha_1, \ldots$ and $\alpha_{m2-1}$ form a standard basis in $GF(2^{m2-1})$; $1 \le j \le t_2$.

Since $t_1$ is greater than $t_2$, matrix $A_y$ and matrix $A_\Omega$ are inevitable larger than matrix $B_y$ and matrix $B_\Omega$, respectively. Since the Chien's search matrix B uses partial elements in the Chien's search matrix A, for convenience of operation, arrangement of the Chien's search matrices should be different than other prior arts. Please see FIG. 5. Each Chien's search matrix is equally divided into a number of portions in the row direction with the number of portions being the same as the number ($t_1$ and $t_2$) of the error correction ability of the corresponding BCH code. Each portion of the Chien's search matrix A has sub-matrices in the corresponding $A_y$ and $A_\Omega$. Each portion of the Chien's search matrix B has sub-matrices in the corresponding $B_y$ and $B_\Omega$. Further let $t_1=7$ and $t_2=4$. Thus the Chien's search matrix A is divided into seven portions, A1, A2, ..., and A7. The Chien's search matrix B is divided into four portions, B1, B2, ..., and B4. Each portion of the Chien's search matrix A includes m1-bit elements length-wise. Each portion of the Chien's search matrix B includes $m_2$-bit elements length-wise.

It should be notice that FIG. 4 and the drawings shown later for illustrating Chien's search matrix are not plotted according to real proportion. They are used just for a proper way for illustration.

Each portion of the Chien's search matrix A is aligned with each portion of the Chien's search matrix B sequentially by a specific method. As shown in FIG. 5, the upper side of each portion of the Chien's search matrix B is aligned with the top side of one portion of the Chien's search matrix A. For example, the upper side of A1 is aligned with the upper side of B1, and the upper side of A2 is aligned with the upper side of B2. It should be noticed that since the Chien's search matrix B is smaller than the Chien's search matrix A, each portion of the Chien's search matrix B is basically separated from other portions. However, every portions of the Chien's search matrix A are substantially connected to each other (dashed lines are used to indicate each portion). In view of the consideration of circuit design, the locations where are not covered by the portions of the Chien's search matrix B in the combined matrix unit 120 are set to be elements of 0. However, the Chien's search matrix A and the Chien's search matrix B can be separated by elements of 0 for identification as shown in FIG. 6. The specific method can be aligning centrally or offsetting a certain amount from one side other than aligning in one side. It should be emphasized that there are many methods to find out the common sub-expressions between the Chien's search matrix A and the Chien's search matrix B. Because these techniques are not in the scope of the present invention, they are not discussed here.

From above, it is clear that in the Chien's search circuit 100, different Chien's search matrices correspond to different values of m ($m_1$ and $m_2$) or t ($t_1$ and $t_2$). In practice, only one of them is different is applicable. In addition, the combined matrix unit 120 can be designed by below steps: first, building $A_y$ and $A_\Omega$; then building $B_y$ and $B_\Omega$; last, finding common sub-expressions to build the combined matrix.

According to the spirit of the present invention, the Chien's search circuit can also include three or more line groups. Under such situation, the arrangement of Chien's search matrix is also different. Please refer to the illustration of another embodiment.

Figure 7:
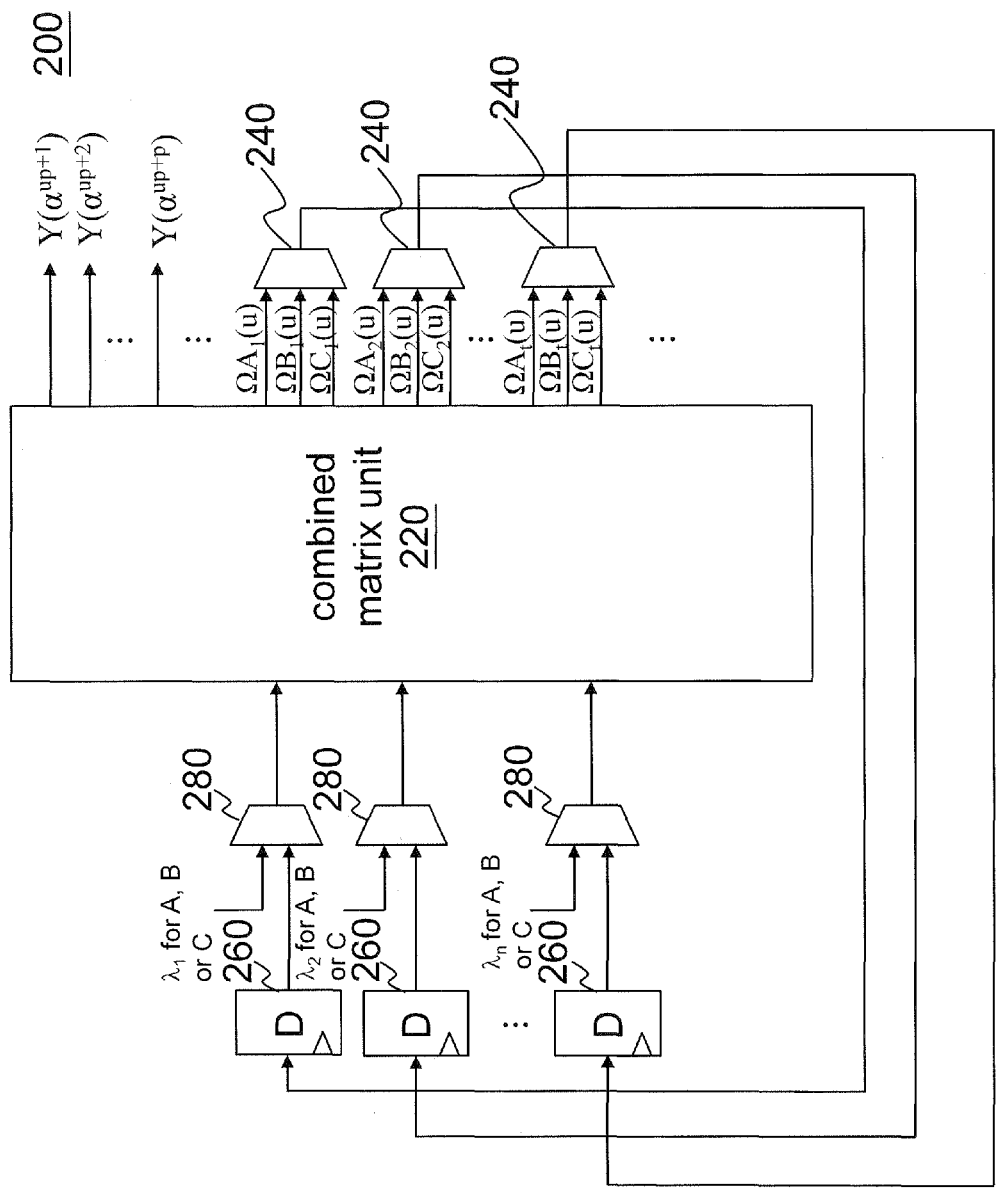
FIG. 7 is another embodiment of a multi-mode Chien's search circuit according to the present invention.

Please refer to FIG. 7, another multi-modes Chien's search circuit 200 s applicable to BCH codes having different values of m in $GF(2^m)$. In the present embodiment, beside the values of m in the previous embodiment, a third value of m, $m_3$ ($m_1 > m_3 > m_2$) is applied. Due to $m_1 > m_3 > m_2$, related code lengths are $2^{m1} > 2^{m3} > 2^{m2}$. The number of error correction ability of the BCH codes corresponding to $m_1$, $m_2$, $m_3$ is $t_1$, $t_2$ and $t_3$, respectively. In the present embodiment, $t_1 > t_3 > t_2$ is set. Let $t_1=7$, $t_2=4$, and $t_3=5$. The Chien's search circuit 200 also includes one combined matrix unit 220, t first multiplexers 240, t registers 260, and t second multiplexers 280. Different functions of the components which correspond to that in the previous embodiment will be described in details below.

The combined matrix unit 220 is the core element. It includes three Chien's search matrices, a Chien's search matrix A, a Chien's search matrix B and a Chien's search matrix C. The Chien's search matrix A and the Chien's search matrix B are the same as that in the last embodiment. The Chien's search matrix C is used to find out the roots of an error location polynomial c. Coefficients of the error location polynomial c are found by receiving a BCH code C3 having $t_3$-error correction ability, finding out syndromes and processing BM algorithm. The combined matrix unit 220 receives a number of inputted values from the second multiplexers 280. The combined matrix unit 220 multiplies the inputted values by partial or all elements in one or more Chien's search matrices to get first operation values and second operation values. In the present embodiment, the Chien's search matrix A and the Chien's search matrix B have common sub-expressions. The Chien's search matrix A and the Chien's search matrix C also have common sub-expressions. Therefore, the Chien's search matrix B and the Chien's search matrix C can all use partial elements in the Chien's search matrix A. However, there are no common sub-expressions in the Chien's search matrix B and the Chien's search matrix C.

Here, the first operation values and second operation values are the same as that defined in the previous embodiment. Different points are: the combined matrix unit 120 is replaced by the combined matrix unit 220; the combined matrix unit 220 can output the first operation values; and the combined matrix unit 220 can output the second operation values in one of the three line groups according to different properties of the inputted values. When the values of coefficients for the same Chien's search matrix are inputted by the second multiplexer 280 in the clock of a first iterative operation and the second operation values computed later therefrom, all have the same properties of the inputted values. For the convenience of operation of the first multiplexer 240, each output of the second operation values for different properties of the inputted values uses a specified line. As shown in FIG. 7, it is one of the two lines linked to the first multiplexers 240. The lines for inputting second operation values $\Omega A_1(u), \Omega A_2(u) \ldots \Omega A_t(u)$ calculated from the Chien's search matrix A are in one line groups. The lines for inputting second operation values $\Omega B_1(u), \Omega B_2(u) \ldots \Omega B_t(u)$ calculated from the Chien's search matrix B are in another line groups. The lines for inputting second operation values $\Omega C_1(u), \Omega C_2(u) \ldots \Omega C_t(u)$ calculated from the Chien's search matrix C are in still another line groups.

In the present embodiment, the number of the first multiplexer 240 is t. Numeral t should be greater than or equal to the bigger one of $t_1$, $t_2$ and $t_3$ so that the BCH code having the maximum error correction ability can be decoded. Meanwhile, the Numeral t is the highest power of the error location polynomial in processed. As mentioned above, each first multiplexer 240 is connected with one line in each line groups and receives specific second operation values from the combined matrix unit 220. The first multiplexer 240 can choose the second operation values from the corresponding line group according to different properties of the inputted values. Then, output the second operation values to the connected register 260.

In the t registers 260, each register 260 is connected to a specific first multiplexer 240, respectively, to receive the second operation values and output the second operation values to the connected second multiplexer 280 in a next clock. Each second multiplexer 280 is connected to a specific register 260, capable of receiving a value of a specific coefficient except a constant coefficient in an error location polynomial (e.g. $\lambda_1, \lambda_2 \ldots \lambda_n$, in FIG. 7) and the second operation values from the register 260. Functions of the second multiplexer 280 are outputting the value of the specific coefficient to the combined matrix unit 220 as the inputted value in a first iterative operation in the beginning of Chien's search operation, and outputting the second operation values as the inputted values to the combined matrix unit 220 in the rest iterative operations of the Chien's search operation.

In this embodiment, structures of the Chien's search matrix A and the Chien's search matrix B are the same as that in the previous embodiment. Chien's search matrix C a form of $[C_y, C_\Omega]$, where $$C_y = \begin{bmatrix} C_{11} & C_{21} & \ldots & C_{p1} \\ C_{12} & C_{22} & \ldots & C_{p2} \\ \vdots & \vdots & \ddots & \vdots \\ C_{1t_1} & C_{2t_1} & \ldots & C_{pt_1} \end{bmatrix},$$

$$C_\Omega = \begin{bmatrix} C_{1p} & 0 & \ldots & 0 \\ 0 & C_{2p} & \ldots & 0 \\ \vdots & \vdots & \ddots & \vdots \\ 0 & 0 & \ldots & C_{t_1 p} \end{bmatrix}, \text{ and}$$

$$C_{ij} = \begin{bmatrix} \alpha_0^{ij} & \alpha_1^{ij} & \ldots & \alpha_{m_3-1}^{ij} \\ \alpha_0^{ij+1} & \alpha_1^{ij+1} & \ldots & \alpha_{m_3-1}^{ij+1} \\ \vdots & \vdots & \ddots & \vdots \\ \alpha_0^{ij+m_3-1} & \alpha_1^{ij+m_3-1} & \ldots & \alpha_{m_3-1}^{ij+m_3-1} \end{bmatrix},$$

where p is the number of parallel computation that the Chien's search circuit has; $t_3$ is the error correction ability corresponding to BCH code $C_3$; $\alpha_0, \alpha_1, \ldots$ and $\alpha_{m_3-1}$ form a standard basis in $GF(2^{m_3-1})$; $1 \leq i \leq p$; $1 \leq j \leq t_3$.

Figure 8:
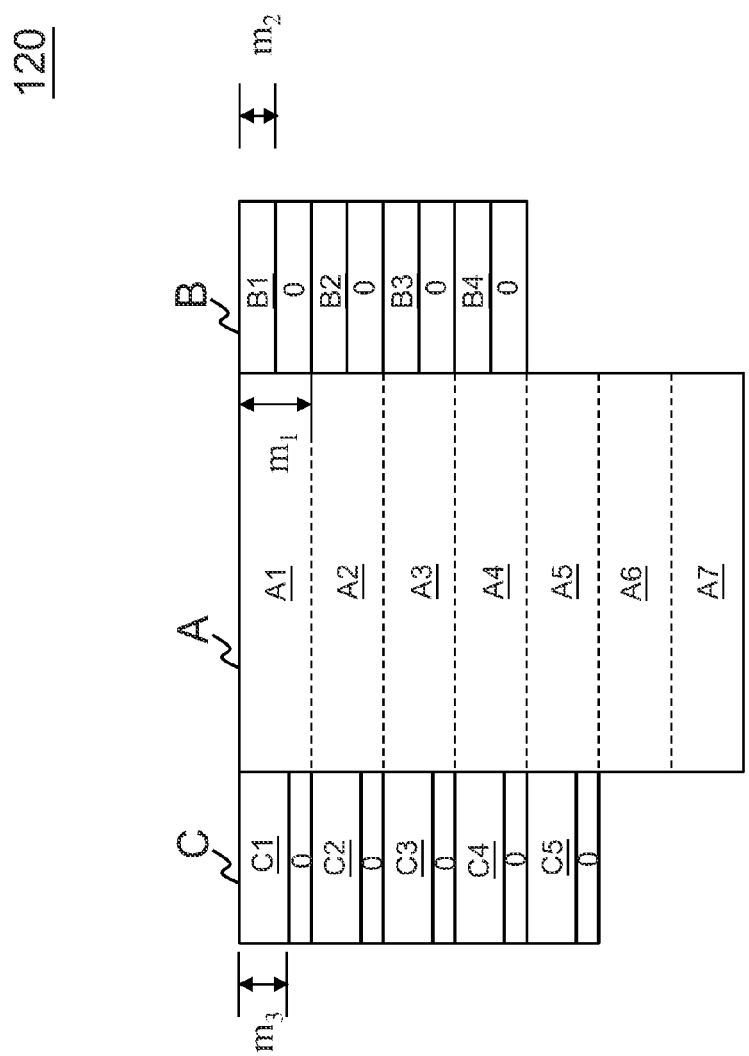
FIG. 8 illustrates an arrangement of a combined matrix unit in the embodiment.

Since t1 is greater than $t_3$ and $t_3$ is greater than $t_2$, matrix $A_y$ and matrix $A_\Omega$ are inevitable larger than matrix $C_y$ and matrix $C_\Omega$, respectively. Matrix $C_y$ and matrix $C_\Omega$ are larger than matrix By and matrix $B_\Omega$, respectively. Arrangement of Chien's search matrices is shown in FIG. 8. Each Chien's search matrix is equally divided into a number of portions in the row direction with the number of portions being the same as the number ($t_1$, $t_2$ and $t_3$) of the error correction ability of the corresponding BCH code. Each portion of the Chien's search matrix A has sub-matrices in the corresponding $A_y$ and $A_\Omega$. Each portion of the Chien's search matrix B has sub-matrices in the corresponding $B_y$ and $B_\Omega$. Each portion of the Chien's search matrix C has sub-matrices in the corresponding $C_y$, and $C_\Omega$. As mentioned above, $t_1=7$, $t_2=4$, and $t_3=5$, the Chien's search matrix A is divided into seven portions, A1, A2, ..., and A7. The Chien's search matrix B is divided into four portions, B1, B2, ..., and B4. The Chien's search matrix C is divided into five portions, B1, B2, ..., and B5. Lengthwise, the Chien's search matrix A and the Chien's search matrix B are the same as that mentioned in the previous embodiment. The Chien's search matrix C includes $m_3$-bit elements.

The portions of Chien's search matrix C are like the portions of Chien's search matrix B which are aligned with portions of the Chien's search matrix A sequentially and respectively by a specific method. As shown in FIG. 8, the upper side of each portion of the Chien's search matrix C is aligned with the top side of one portion of the Chien's search matrix A. For example, the upper side of A1 is aligned with the upper side of C1, and the upper side of A5 is aligned with the upper side of B5. Since the Chien's search matrix C is smaller than the Chien's search matrix A, each portion of the Chien's search matrix C is basically separated from other portions. The locations where are not covered by the portions of the Chien's search matrix B and the Chien's search matrix C in the combined matrix unit 220 are set to be elements of 0.

In the present embodiment, two Chien's search matrices (the Chien's search matrix A and the Chien's search matrix B, or the Chien's search matrix A and the Chien's search matrix C) have common sub-expressions in partial elements. One Chien's search matrix can uses the common sub-expressions in the other Chien's search matrix. However, the Chien's search matrix B and the Chien's search matrix C don't have common sub-expressions. In practice, there can be common sub-expressions between the Chien's search matrix B and the Chien's search matrix C. Even there are common sub-expressions between any two Chien's search matrices of the three Chien's search matrices but all of the three Chien's search matrices have no common sub-expressions.

While the invention has been described in terms of what is presently considered to be the most practical and preferred embodiment, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A multi-code Chien's search circuit for Bose-Chaudhuri-Hocquenghem (BCH) codes with various exponents (m) in Galois Field (GF) ($2^m$), comprising:
    a combined matrix unit, for providing a plurality of Chien's search matrices, receiving a plurality of inputted values, multiplying the inputted values by partial or all elements in one or more Chien's search matrix to get first operation values and second operation values, outputting the first operation values, and outputting the second operation values according to different properties of the inputted values via one of a plurality of line groups;
    a plurality of first multiplexers, each first multiplexer connected with one line in each line group and receiving specific second operation values, for choosing the second operation values from the corresponding line group according to different properties of the inputted values, and outputting the second operation values;
    a plurality of registers, each register connected with a specific first multiplexer, for receiving the second operation values, and outputting the second operation values in a next clock cycle after the plurality of registers receive the second operation values from the plurality of first multiplexers; and
    a plurality of second multiplexers, each second multiplexer connected with a specific register, receiving a value of a specific coefficient except a constant coefficient in an error location polynomial and the second operation values from the register, for outputting the value of the specific coefficient as the inputted value to the combined matrix unit in the first iterative operation of Chien's search, and outputting the second operation values to the combined matrix unit as the inputted values in the rest iterative operations of Chien's search,
    wherein values of specific coefficients of the error location polynomial for the same Chien's search matrix and the second operation values obtained by processing the values of specific coefficients have the same properties of the inputted values.

2. The Chien's search circuit according to claim 1, wherein the Chien's search matrix has a form of $[A_y\ A_\Omega]$, where $$A_y = \begin{bmatrix} A_{11} & A_{21} & \cdots & A_{p1} \\ A_{12} & A_{22} & \cdots & A_{p2} \\ \vdots & \vdots & \ddots & \vdots \\ A_{1t} & A_{2t} & \cdots & A_{pt} \end{bmatrix},$$

$$A_\Omega = \begin{bmatrix} A_{1p} & 0 & \cdots & 0 \\ 0 & A_{2p} & \cdots & 0 \\ \vdots & \vdots & \ddots & \vdots \\ 0 & 0 & \cdots & A_{tp} \end{bmatrix}, \text{ and}$$

$$A_{ij} = \begin{bmatrix} \alpha_0^{ij} & \alpha_1^{ij} & \cdots & \alpha_{m-1}^{ij} \\ \alpha_0^{ij+1} & \alpha_1^{ij+1} & \cdots & \alpha_{m-1}^{ij+1} \\ \vdots & \vdots & \ddots & \vdots \\ \alpha_0^{ij+m-1} & \alpha_1^{ij+m-1} & \cdots & \alpha_{m-1}^{ij+m-1} \end{bmatrix},$$

where p is a number of parallel computations that the Chien's search circuit has; t is an error correction ability corresponding to the BCH code; $\alpha_0, \alpha_1, \ldots$ and $\alpha_{m-1}$ form a standard basis in GF($2^m$); $1 \le i \le p$; $1 \le j \le t$.

3. The Chien's search circuit according to claim 2, wherein different Chien's search matrices corresponds to different values of m and/or t.

4. The Chien's search circuit according to claim 2, wherein each Chien's search matrix is equally divided into a plurality of portions in the row direction with the number of portions being the same as the number of the error correction ability of the corresponding BCH code; each portion has sub-matrices in the corresponding $A_y$ and $A_\Omega$.

5. The Chien's search circuit according to claim 4, wherein each portion of one Chien's search matrix is aligned with that of another Chien's search matrix sequentially by a method.

6. The Chien's search circuit according to claim 5, wherein the method is aligning in one side, aligning centrally, or offsetting a certain amount from one side.

7. The Chien's search circuit according to claim 5, wherein the locations where are not covered by the portions of the Chien's search matrix are set to be elements of 0 in the combined matrix unit.

8. The Chien's search circuit according to claim 5, wherein the Chien's search matrices are separated by elements of 0.

9. The Chien's search circuit according to claim 1, wherein there are common sub-expressions in partial elements in two Chien's search matrices and one Chien's search matrix utilizes the common sub-expressions of the other Chien's search matrix.

10. The Chien's search circuit according to claim 1, wherein the first operation value further adds to a value of a constant coefficient of the error location polynomial; if the sum is 0, the corresponding element, $\alpha^{ip+i}$ where $1 \le i \le p$, is a root of the error location polynomial.

* * * * *